United States Patent
Li et al.

(10) Patent No.: US 9,418,965 B1
(45) Date of Patent: Aug. 16, 2016

(54) EMBEDDED INTERPOSER WITH THROUGH-HOLE VIAS

(71) Applicant: Altera Corporation, San Jose, CA (US)

(72) Inventors: Zhe Li, San Jose, CA (US); Yuanlin Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 127 days.

(21) Appl. No.: 14/524,732

(22) Filed: Oct. 27, 2014

(51) Int. Cl.
| | |
|---|---|
| *H01L 21/52* | (2006.01) |
| *H01L 25/065* | (2006.01) |
| *H01L 25/00* | (2006.01) |
| *H01L 23/495* | (2006.01) |
| *H01L 23/538* | (2006.01) |
| *H01L 21/48* | (2006.01) |

(52) U.S. Cl.
CPC .......... *H01L 25/0655* (2013.01); *H01L 21/486* (2013.01); *H01L 21/4857* (2013.01); *H01L 21/52* (2013.01); *H01L 23/49582* (2013.01); *H01L 23/5384* (2013.01); *H01L 23/5386* (2013.01); *H01L 25/50* (2013.01)

(58) Field of Classification Search
CPC ........... H01L 23/48; H01L 29/40; H05K 3/10
See application file for complete search history.

(56) References Cited

U.S. PATENT DOCUMENTS

| | | | |
|---|---|---|---|
| 7,626,254 B2 | 12/2009 | O et al. | |
| 8,063,475 B2 | 11/2011 | Choi et al. | |
| 8,338,934 B2 | 12/2012 | Wu et al. | |
| 8,384,227 B2 | 2/2013 | Cho et al. | |
| 8,587,132 B2 | 11/2013 | Zhao et al. | |
| 8,829,656 B2 | 9/2014 | Zhao et al. | |
| 8,830,689 B2 | 9/2014 | Kim et al. | |
| 2005/0133935 A1* | 6/2005 | Vasishta | H01L 23/49833 257/782 |
| 2012/0286419 A1 | 11/2012 | Kwon et al. | |
| 2013/0105213 A1* | 5/2013 | Hu | H05K 3/4038 174/266 |
| 2013/0277855 A1* | 10/2013 | Kang | H01L 23/49816 257/774 |
| 2014/0070380 A1 | 3/2014 | Chiu et al. | |

* cited by examiner

*Primary Examiner* — Roy Potter
(74) *Attorney, Agent, or Firm* — Michael H. Lyons

(57) ABSTRACT

A method of forming an integrated circuit package may include forming a first layer of a package substrate and mounting an interposer structure on the first layer of a substrate. In some instances, adhesive is used to attach the interposer structure to the first layer of the substrate. After the interposer structure is mounted on the first layer of the substrate, at least one hole is formed through the interposer structure. The hole may be filled with a conductive material such as copper to form a through-hole via in the interposer structure. A second layer of the substrate may be formed over the interposer structure and the first layer of the substrate. Integrated circuit (IC) dies may be mounted on the substrate and signals may be routed between the IC dies via the interposer structure embedded in the substrate.

20 Claims, 5 Drawing Sheets

EMBEDDED INTERPOSER WITH THROUGH-HOLE VIAS

BACKGROUND

An integrated circuit (IC) die is generally packaged to protect the die from external contamination or physical damage. As demand for high performance devices grows, more than one IC die may be included in a single IC package to meet the demand of high speed applications. In a multi-die IC package, two (or more) IC dies may be placed adjacent to each other on an interposer structure placed on top of a package substrate. Such an IC package is commonly referred to as a 2.5-dimensional (2.5D) IC package.

Typically, in a 2.5D IC package, through silicon vias (TSVs) are formed in the interposer to transmit signals from the IC dies on top of the interposer to the package substrate at the bottom of the interposer. Metal traces are also formed in the interposer to transmit signals between the IC dies that are placed on top of the interposer. However, in order to accommodate the IC die(s) on top of the interposer, a relatively large (at least as wide as or wider than the IC die or dies placed on top) interposer structure is needed.

As demand for high speed applications grows, higher-density package substrates with narrower trace widths are needed to support such applications. Such a package substrate (i.e., a package substrate with a relatively high routing density) is generally more costly compared to a package substrate with a lower routing density.

As an alternative, a silicon bridge structure may be formed or placed in the package substrate to provide high density chip-to-chip connections. The silicon bridge structure is typically smaller in size compared to an interposer and may therefore be a more cost-effective solution. However, it may not be as power efficient as there are typically no direct power connections from the silicon bridge to the IC die(s). This may lead to a higher voltage drop due to the relatively longer traces or interconnect paths needed for power or ground connections. Furthermore, there may be routing congestion in the device since power connections may need to be routed from the center of the IC die(s) to other parts of package substrate away from the silicon bridge structure.

It is within this context that the embodiments described herein arise.

SUMMARY

Integrated circuit (IC) packages with an embedded interposer structure with vias and techniques for manufacturing such IC packages are provided. Embodiments of the present invention include techniques to form a package substrate with an embedded interposer structure with interconnects that form direct connections with metal layers in the package substrate.

It is appreciated that the present invention can be implemented in numerous ways, such as a process, an apparatus, a system, or a device. Several inventive embodiments of the present invention are described below.

A method may include forming a first layer of a substrate and mounting an interposer structure on the first layer of the substrate. After the interposer is mounted on the first layer of the substrate, holes may be formed through the interposer structure. As an example, the interposer structure may be drilled to form holes that extend from one surface of the interposer structure to an opposing surface. A second layer of the substrate may be formed over the interposer structure and the first layer of the substrate. The interposer structure is therefore embedded in the substrate. The holes formed in the interposer structure may provide direct connections between the interposer structure and the substrate.

An integrated circuit package may include an integrated circuit die mounted on a package substrate that is produced by a process that includes any or all of the steps described above. The integrated circuit die may be electrically coupled to the interposer structure embedded in the package substrate. In one scenario, the embedded interposer structure may be a high-density (i.e., a higher routing density compared to that of the package substrate) organic interposer made from polymer or an epoxy based organic material.

DETAILED DESCRIPTION

The embodiments provided herein include package substrates with embedded interposer structures and techniques to manufacture integrated circuit (IC) packages that include such package substrates.

It will be obvious, however, to one skilled in the art, that the present exemplary embodiments may be practiced without some or all of these specific details. In other instances, well-known operations have not been described in detail in order not to unnecessarily obscure the present embodiments.

Figure 1:
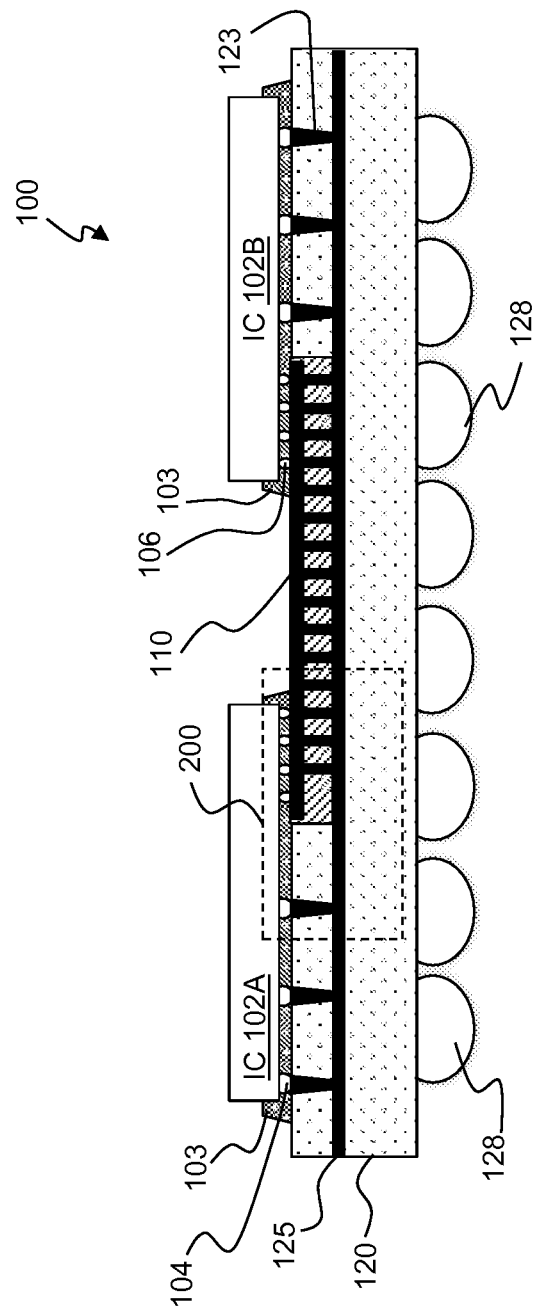
FIG. 1 shows an illustrative integrated circuit package having a package substrate with an embedded interposer in accordance with embodiments of the present invention.

FIG. 1 shows an illustrative integrated circuit package having a package substrate with an embedded interposer in accordance with embodiments of the present invention. As shown in FIG. 1, IC package 100 includes IC dies 102A and 102B disposed adjacent to each other on a top surface of package substrate 120. Signals from IC dies 102A and 102B may be transmitted to package substrate 120 via conductive microbumps 104. The signals may then be transmitted out of IC package 100 via conductive solder balls 128 on the bottom surface of package substrate 120. As an example, solder balls 128 may couple IC package 100 to external circuitry such as a printed circuit board (PCB) that is not shown in FIG. 1 for the sake of clarity.

In the example of FIG. 1, package substrate 120 includes a conductive layer 125 and an embedded interposer structure 110. Embedded interposer 110 may be attached to conductive layer 125 (e.g., a bottom surface of interposer 110 may be attached to conductive layer 125). Routing interconnects such as through-hole vias within embedded interposer 110 may thus be directly connected to conductive layer 125 of substrate 120. In a typical 2.5-dimensional (2.5D) IC package, the interposer is disposed on top of the package substrate and IC dies (e.g., IC dies 102A and 102B) are disposed adjacent to each other on top of the interposer. However, in the example of FIG. 1, interposer 110 is embedded within package substrate 120. Such a configuration may allow signals to be routed between IC dies 102A, 102B, and package substrate 120 without requiring an interposer having a size equal to or greater than that of the combined area of the IC dies 102A and 102B.

In some instances, when a higher-density package substrate with narrower trace widths (e.g., widths of 12 micrometer or less) is needed to support high-speed applications, high-speed signals may be routed through embedded interposer 110 instead of package substrate 120. In such instances, embedded interposer 110 may have a routing density level that is greater than that of package substrate 120. Such configurations may be more cost-effective compared to having a full high-density package substrate.

As shown in FIG. 1, ICs 102A and 102B are electrically connected to package substrate 120 (and the embedded interposer 110) via conductive interconnects 104 and 106. Interconnects 104 may be microbumps that are coupled to interconnects 123 in package substrate 120 whereas interconnects 106 may be fine-pitch microbumps that are coupled to interconnects in embedded interposer 110. It should be noted that the cavity between microbumps 104 and fine-pitch microbumps 106, on package substrate 120 and embedded interposer 110 respectively, and ICs 102A and 102B may be filled with under-fill material or sealing resin such as resin 103. The interconnects in package substrate 120 and embedded interposer 110 may be coupled to conductive layer 125 in package substrate 120. An example of highlighted region 200 of FIG. 1, which includes the different interconnects in package substrate 120 and embedded interposer 110, is shown in detail with reference to FIG. 2.

Figure 2:
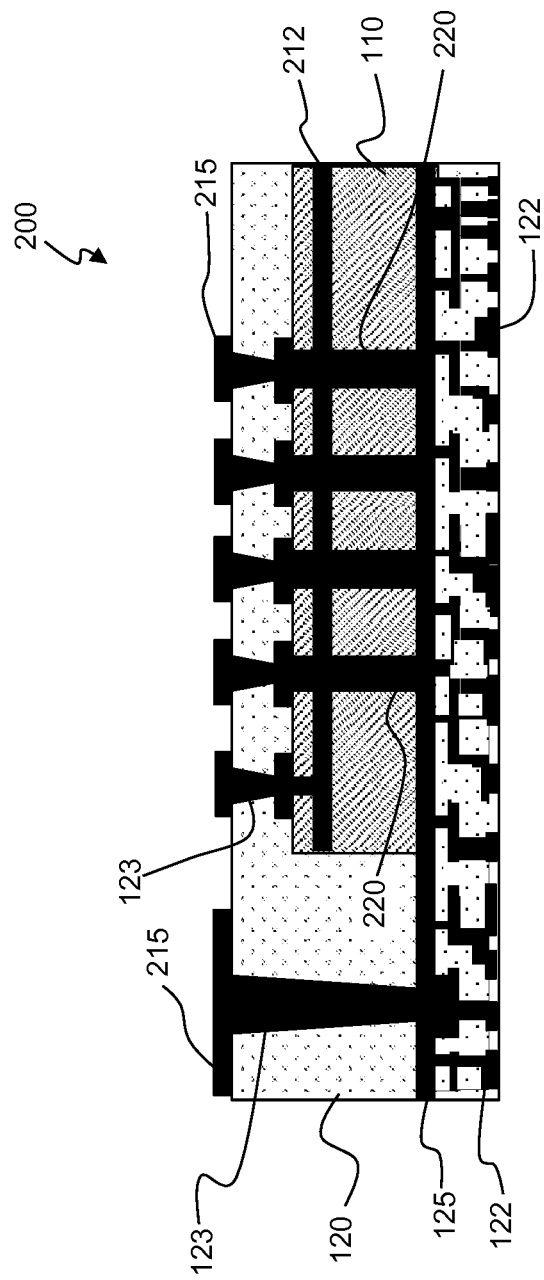
FIG. 2 shows an enlarged region of the integrated circuit package shown in FIG. 1 in accordance with embodiments of the present invention.

FIG. 2 shows enlarged region 200 of FIG. 1 in accordance with embodiments of the present invention. As highlighted in region 200 of package substrate 120, embedded interposer 110 may be connected directly to conductive layer 125. The top surface of package substrate 120 may include contact pads 215 to which microbumps 104 and fine-pitch microbumps 106 (shown in FIG. 1) are connected (e.g., bumps 106 and 104 may be formed on top of contact pads 215). Contact pads 215 are accordingly connected to interconnects 123 within package substrate 120. Some interconnects 123 may be directly coupled to conductive layer 125 (or some other routing traces in package substrate 120 that are not shown herein) whereas others may be connected to embedded interposer 110.

Embedded interposer 110 may include other interconnects or traces 212 for routing signals within embedded interposer 110. When multiple ICs (e.g., ICs 102A and 102B of FIG. 1) are placed on top of package substrate 120, interconnects or traces 212 may form part of a chip-to-chip interconnect structure that is used to transmit signals between the ICs. Through-hole vias 220 may also be formed within embedded interposer 110 such that they are directly connected to conductive layer 125.

In one embodiment, conductive layer 125 may be a power plane that is disposed on a layer of package substrate. In one scenario, conductive layer 125 may be coupled to a power supply and the IC die (e.g., either IC die 102A or 102B of FIG. 1) that is placed on package substrate 120 and embedded interposer 110 may receive direct power supply from conductive layer 125 via any one of through-hole vias 220. This may improve power delivery within the IC package and may potentially reduce voltage drop in the IC package as embedded interposer 110 may be quite thin (e.g., 20-30 micrometers) and a direct power supply may be conveyed by through-hole vias 220. As through-hole vias 220 may be connected directly to conductive layer 125, via alignment may not be needed compared to a typical reflow process where vias need to be connected to individual contact pads or bumps. Routing paths 122, formed by metal traces and vias within package substrate 120, may connect conductive layer 125 to other interconnects (e.g., solder balls 128 of FIG. 1) that may be formed on the bottom surface of package substrate 120.

In one embodiment, embedded interposer 110 may be an organic interposer (e.g., made of either polymer or an epoxy based organic material). As an example, embedded interposer 110 may be a thin interposer (e.g., 20-30 micrometers) that is bonded to package substrate 120 (more specifically, conductive layer 125) with adhesive. Through-hole vias 220 may be formed in embedded interposer 110 after the interposer is attached to package substrate 120. FIGS. 3A-3E are cross-sectional views of a region (e.g., region 200 of FIG. 2) of a package substrate with an embedded interposer at different fabrication stages in accordance with embodiments of the present invention. It should be noted that the structures shown in FIGS. 3A-3E (and other structures shown in FIGS. 1 and 2) are merely illustrative and are not necessarily drawn to scale.

Figure 3A:
FIGS. 3A-3E are cross-sectional views of a region of an illustrative package substrate with an embedded interposer at different fabrication stages in accordance with embodiments of the present invention.

FIG. 3A shows cross-section 300A of a partially formed package substrate. As shown in FIG. 3A, conductive layer 125 is formed over substrate layer 120A. As an example, conductive layer 125 may be a copper (Cu) layer that is formed and attached to substrate layer 120A via adhesive. It should be noted that a package substrate can be made from a variety of materials (e.g., bismaleimide triazine (BT) resin, ceramic, polymide flex tape, etc.). As such, substrate layer 120A may be a layer of BT substrate. Referring to cross-section 300B of FIG. 3B, after conductive layer 125 has been disposed on substrate layer 120A, interposer structure 110A is disposed on the partially formed package substrate. At this stage, interconnects 212 may be formed in interposer structure 110A. Interconnects 212 thus formed may, for example, be used as chip-to-chip interconnects that transmit signals between ICs (e.g., IC 102A and IC 102B of FIG. 1) that are to be placed on the resulting package substrate.

Figure 3B:
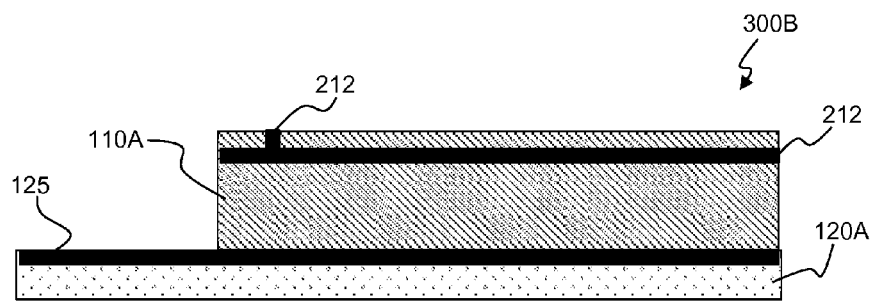

In one embodiment, interposer structure 110A is attached to conductive layer 125 with adhesive (not explicitly shown in FIG. 3B). In some instances, interposer structure 110A may be an organic interposer with a thickness of less than 30 micrometers. It should be noted that at this stage, through-hole vias have not been formed in the interposer structure 110A. In this instance, holes may be formed in interposer structure 110A (e.g., by drilling or using laser ablation) after interposer structure 110A has been attached to conductive layer 125.

Figure 3C:
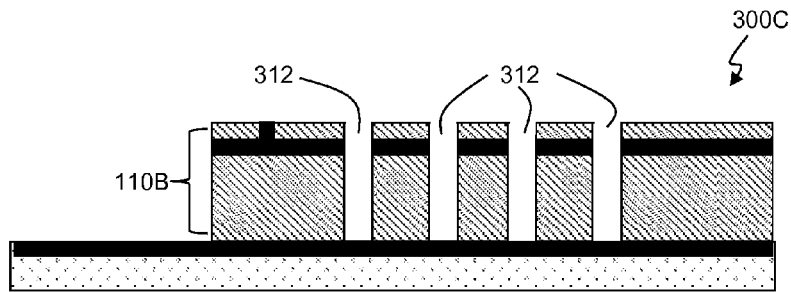

FIG. 3C shows cross-section 300C of the resulting structure after holes have been formed in the interposer structure. Interposer structure 110B includes multiple holes 312. As an example, holes 312 may be drilled from the top surface of interposer structure 110A after the interposer structure is attached to conductive layer 125 as shown in FIG. 3B. Accordingly, holes 312 may be plated with a conductive material to form conductive through-hole vias within the interposer structure.

Figure 3D:
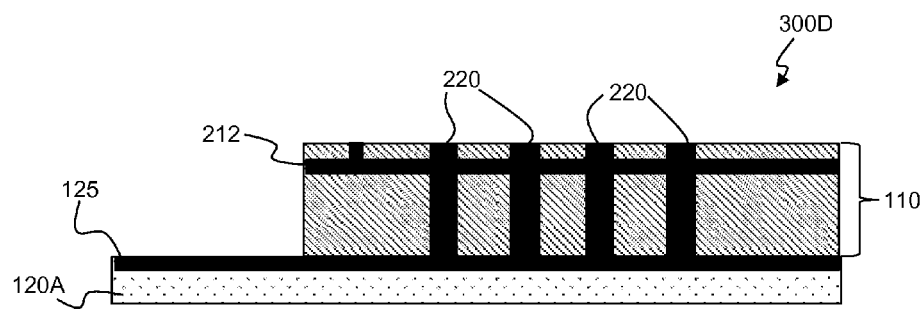

FIG. 3D shows cross-section 300D of the resulting structure after the formation of through-hole vias 220 within interposer structure 110. At this stage, a complete interposer structure 110 with through-hole vias 220 and interconnects 212 is formed on top of substrate layer 120A (or, more specifically, conductive layer 125). In one embodiment, through-hole vias 220 may be directly connected to conductive layer 125 without any additional interconnects such as solder bumps formed in between vias 220 and conductive layer 125. As such, a separate solder reflow process is not needed in this scenario. This may subsequently reduce thermal damage to the overall structure as a high-temperature bonding process is not needed in this context.

Figure 3E:
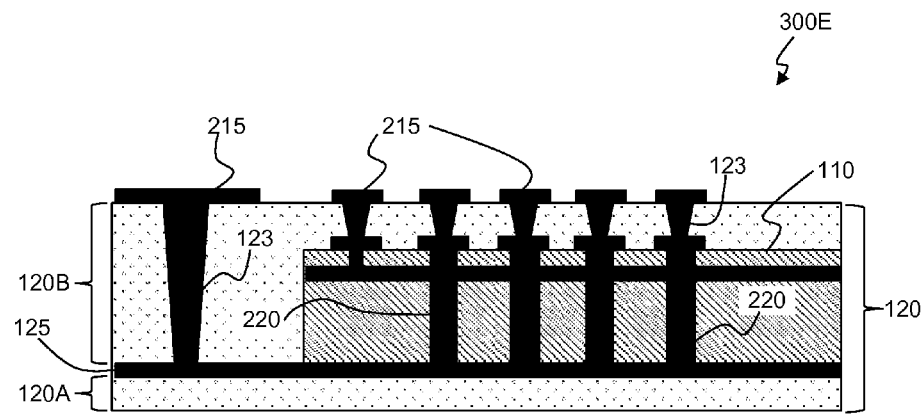

After through-hole vias 220 have been formed, another substrate layer may be formed over interposer structure 110 and conductive layer 125 such that interposer structure 110 is embedded in the resulting package substrate. FIG. 3E shows cross-section 300E of package substrate 120 with embedded interposer 110. It should be noted that cross-section 300E shares similarities with the cross-section of region 200 shown in FIG. 2. As such, elements that are shown and described above with reference to FIG. 2 are designated with the same reference numbers and are not described in detail below.

Referring to FIG. 3E, after through-hole vias 220 have been formed, another substrate layer 120B is formed over interposer structure 110 and conductive layer 125. Substrate layer 120A and substrate 120B collectively form package substrate 120 (e.g., layers 120A and 120B may be formed from the same material). Interconnects 123 may also be formed within package substrate 120. As shown in FIG. 3E, interconnects 123 connect conductive layer 125 (and other traces within package substrate 120 that are not shown), and embedded interposer structure 110 to IC die(s) that are to be placed on top of package substrate 120. As an example, microbumps may be formed on bump pads 215 on the top surface of package substrate 120. As shown in FIG. 1, microbumps 104 and fine-pitch microbumps 106 connect IC dies 102A and 102B to package substrate 120 and embedded interposer 110.

Figure 4:
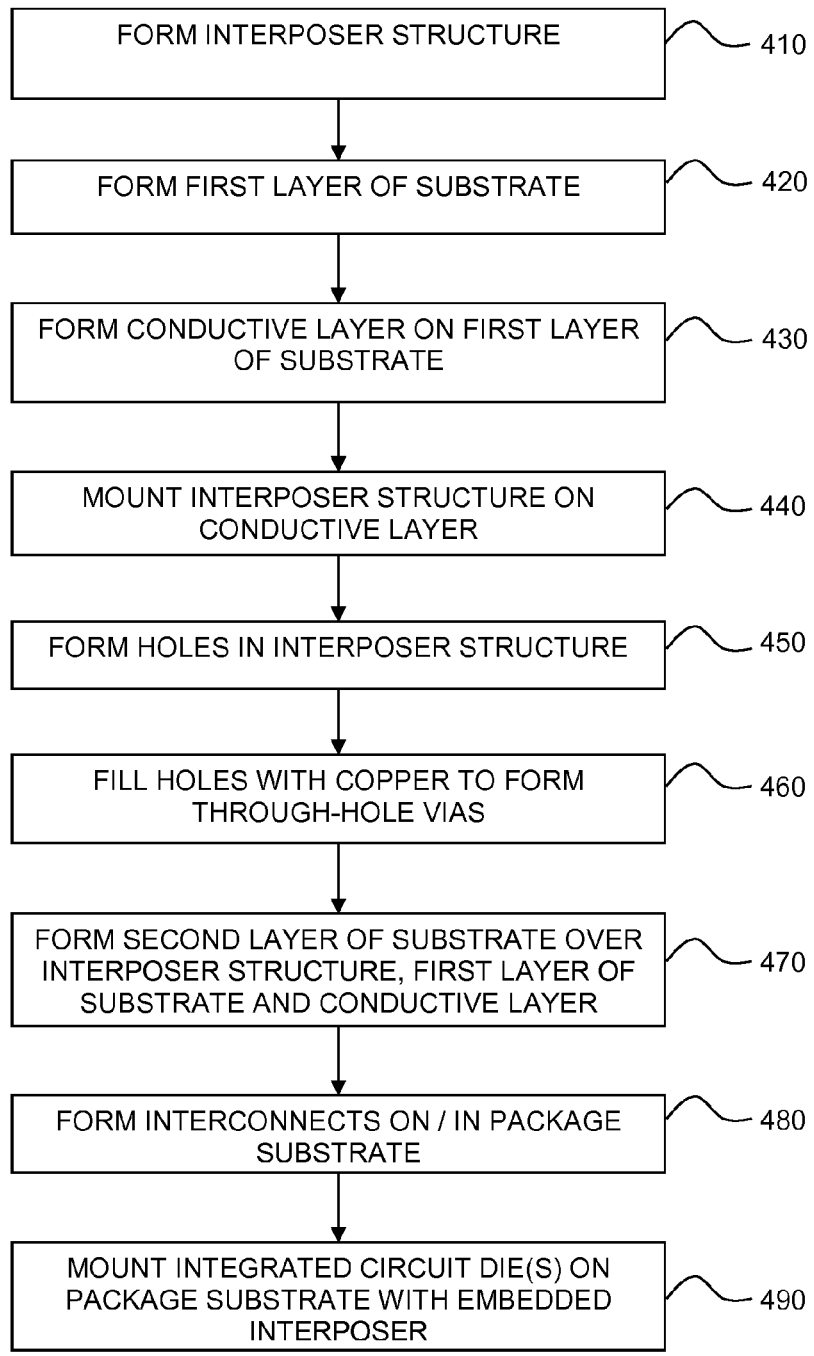
FIG. 4 shows illustrative steps for manufacturing an integrated circuit package with an embedded interposer in accordance with embodiments of the present invention.

FIG. 4 shows illustrative steps for manufacturing an IC package with an embedded interposer in accordance with embodiments of the present invention. At step 410, an interposer structure is formed. As an example, interconnects may be formed on a wafer (e.g., a passive wafer). Wafer thinning may then be performed to reduce the thickness of the wafer to less than 30 micrometers. The wafer may then be diced to obtain multiple interposer structures. In one embodiment, the resulting interposer structures are organic interposers.

At step 420, a first layer 120A of substrate is formed. Subsequently, a conductive layer (e.g., layer 125) is formed on the first layer 120A of substrate at step 430. It should be noted that steps 420 and 430 may be performed in parallel with step 410 (i.e., the first layer of substrate and the conductive layer may be formed concurrently with the interposer structure). At step 440, interposer structure 110 is mounted on conductive layer 125. In one embodiment, the interposer structure 110 is attached to the conductive layer 125 with adhesive. At this stage, the resulting structure may be similar to cross section 300B shown in FIG. 3B.

At step 450, holes 312 are formed in interposer structure 110. In one embodiment, the holes may be formed by drilling through a surface of interposer 110. In another embodiment, the holes may be formed by laser ablation. At step 460, holes 312 are filled with copper to form through-hole vias 220. As shown in FIG. 3D, through-hole vias 220 in interposer 110 are filled with a conductive material such as copper. At step 470, a second layer 120B of substrate is formed over the interposer structure, the first layer of substrate, and the conductive layer. At this stage, the interposer structure is embedded between the two layers of substrate that form the package substrate.

At step 480, interconnects may be formed in and on the package substrate. As shown in FIG. 3E, interconnects 123 formed in package substrate 120 are coupled either to conductive layer 125 or embedded interposer structure 110. Contact pads 215 formed on package substrate 120 accordingly connect interconnects 123 within package substrate 120 to microbumps that may be formed on the package substrate. At step 490, IC die(s) may be mounted on the package substrate.

In the embodiment of FIG. 1, IC dies 102A and 102B are mounted on package substrate 120 with embedded interposer 110.

As shown in FIG. 1, IC dies 102A and 102B may be electrically coupled to the embedded interposer via fine-pitch microbumps 106 and interconnects that are embedded in package substrate 120. In one scenario, signals (e.g., high-speed signals) are routed between the IC dies via interconnects in the embedded interposer. In this scenario, the embedded interposer may have a routing density that is greater than that of the package substrate and the width of interconnect traces formed in the embedded interposer may be finer than that in the package substrate.

It should be appreciated that even though a specific configuration is shown in the embodiment of FIG. 1, different configurations may be employed in this context (e.g., more or fewer IC dies may be mounted on a package substrate with an embedded interposer). The use of flip chip ball grid array IC packages is not meant to be limiting as the techniques described herein may be applied to other packaging configurations (e.g., heat spreader ball grid arrays (HSBGAs), low profile ball grid arrays (LBGAs), thin fine pitch ball grid array (TFBGAs), flip chip chip-scale packages (FCCSPs), etc).

The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:
1. A method, comprising:
   forming a first layer of a substrate;
   mounting an interposer structure on the first layer of the substrate, wherein the interposer structure has a first surface that faces the first layer of the substrate and a second surface;
   after mounting the interposer structure on the first layer of the substrate, forming at least one hole through the interposer structure; and forming a second layer of the substrate over the second surface of the interposer structure and the first layer of the substrate.

2. The method defined in claim 1, further comprising:
forming a conductive layer on the first layer of the substrate prior to mounting the interposer structure on the first layer of the substrate, wherein the interposer structure is mounted directly onto the conductive layer.

3. The method defined in claim 1, wherein mounting the interposer structure on the first layer of the substrate comprises:
attaching the interposer structure to the first layer of the substrate with adhesive.

4. The method defined in claim 1, further comprising:
prior to forming the second layer of the substrate, plating an inner surface of the at least one hole in the interposer structure with copper.

5. The method defined in claim 1, further comprising:
forming a plurality of interconnects on the second surface of the interposer structure.

6. The method defined in claim 5, further comprising:
mounting a first integrated circuit die and a second integrated circuit die to the substrate, wherein the first and second integrated circuit dies are electrically coupled to the interposer structure via the plurality of interconnects; and
routing signals between the first and second integrated circuit dies via the interposer structure.

7. The method defined in claim 1, wherein the substrate exhibits a first routing density level and the interposer structure exhibits a second routing density level that is greater than the first routing density level, the method further comprising:
forming a plurality of routing traces in the interposer structure prior to mounting the interposer structure on the first layer of the substrate so that the interposer structure exhibits the second routing density level.

8. An integrated circuit package produced by a process comprising the steps of:
disposing an interposer structure over a first layer of a substrate;
after disposing the interposer structure over the first layer of the substrate, forming at least one hole through the interposer structure;
forming a second layer of the substrate over the interposer structure and the first layer of the substrate;
forming a plurality of interconnects on the interposer structure; and
mounting an integrated circuit die on the second layer of the substrate, wherein the integrated circuit die is electrically coupled to the interposer structure via at least one interconnect in the plurality of interconnects.

9. The integrated circuit package produced by the process defined in claim 8, further comprising:
forming a conductive layer over the first layer of the substrate prior to disposing the interposer structure over the first layer of the substrate, wherein the interposer structure is disposed over the conductive layer.

10. The integrated circuit package produced by the process defined in claim 9, wherein disposing the interposer structure over the first layer of the substrate comprises:
attaching the interposer structure to the conductive layer with adhesive.

11. The integrated circuit package produced by the process defined in claim 8, further comprising:
plating an inner surface of the at least one through hole with copper prior to forming the second layer of the substrate over the interposer structure and the first layer of the substrate.

12. The integrated circuit package produced by the process defined in claim 8, further comprising:
mounting an additional integrated circuit die on the second layer of the substrate; and
routing signals between the integrated circuit die and the additional integrated circuit die via the interposer structure and the plurality of interconnects on the interposer structure.

13. The integrated circuit package produced by the process defined in claim 7, wherein the substrate has a first routing density level and wherein the interposer structure has a second routing density level that is greater than the first routing density level.

14. An integrated circuit package, comprising:
a substrate having at least one conductive layer;
an interposer structure embedded within the substrate, wherein a first surface of the interposer structure is attached to the at least one conductive layer;
at least one through-hole via formed in the interposer structure, wherein the at least one through-hole via is directly connected to the conductive layer in the substrate;
a plurality of interconnects formed on a second surface of the interposer structure that opposes the first surface, wherein at least one interconnect of the plurality of interconnects is electrically coupled to the at least one through-hole via; and
an integrated circuit die mounted on the substrate, wherein the integrated circuit die is electrically coupled to the interposer structure through the at least one interconnect in the plurality of interconnects.

15. The integrated circuit package defined in claim 14, wherein the substrate has a first routing density level and wherein the interposer structure has a second routing density level that is greater than the first routing density level.

16. The integrated circuit package defined in claim 15 further comprising:
an additional integrated circuit die mounted on the substrate, wherein the additional integrated circuit die is electrically coupled to the interposer structure to route signals between the integrated circuit die and the additional integrated circuit die via the interposer structure.

17. The integrated circuit package defined in claim 16, wherein the conductive layer is coupled to a power supply and the integrated circuit die receives power from the power supply through the conductive layer and the at least one through-hole via.

18. The integrated circuit package defined in claim 17, wherein the signals routed via the interposer structure comprise high-speed input-output signals.

19. The integrated circuit defined in claim 14, wherein the second surface is attached to the conductive layer using adhesive.

20. The integrated circuit defined in claim 14, wherein the interposer structure comprises an organic interposer having a thickness of less than 30 micrometers.

* * * * *